US012578400B2

(12) United States Patent
Williams et al.

(10) Patent No.: US 12,578,400 B2
(45) Date of Patent: Mar. 17, 2026

(54) STATE OF HEALTH MONITORING RESISTANCE TO POWERPACK

(71) Applicant: Steering Solutions IP Holding Corporation, Saginaw, MI (US)

(72) Inventors: David M. Williams, Millington, MI (US); Ashish Verma, Cedar Rapids, IA (US); Julie A. Kleinau, Bay City, MI (US); Peter D. Schmitt, Farmington Hills, MI (US); Christopher J. Sommer, Swartz Creek, MI (US); Kevin L. Derry, Wheeler, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 155 days.

(21) Appl. No.: 18/403,653

(22) Filed: Jan. 3, 2024

(65) Prior Publication Data

US 2025/0116731 A1 Apr. 10, 2025

Related U.S. Application Data

(60) Provisional application No. 63/542,451, filed on Oct. 4, 2023.

(51) Int. Cl.
*G01R 31/66* (2020.01)
*B62D 5/04* (2006.01)
*G01R 31/00* (2006.01)

(52) U.S. Cl.
CPC ........... *G01R 31/66* (2020.01); *B62D 5/0481* (2013.01); *G01R 31/006* (2013.01)

(58) Field of Classification Search
CPC ..... G01R 31/66; G01R 31/006; B62D 5/0481
See application file for complete search history.

(56) References Cited

U.S. PATENT DOCUMENTS 8,164,343 B2 * 4/2012 Bertness ............. G01R 31/006
324/543
2003/0038637 A1 * 2/2003 Bertness ............. H02J 7/00047
324/426

(Continued)

OTHER PUBLICATIONS

D. Hilmert, H. Yuan and J. Song, "The Analysis of Failure Mechanisms of Electrical Connectors in Long-term Use Field Vehicles," 2022 IEEE 67th Holm Conference on Electrical Contacts (HLM), Tampa, FL, USA, 2022, pp. 1-8, doi: 10.1109/HLM54538.2022. 9969820.

(Continued)

*Primary Examiner* — Akm Zakaria
(74) *Attorney, Agent, or Firm* — Dickinson Wright PLLC

(57) ABSTRACT

A method for determining a state of health (SOH) of an electrical connection in a steering system includes, using a processor configured to execute instructions, receiving an input indicative of the SOH of the electrical connection, the input including a resistance associated with the electrical connection, and the SOH corresponding to at least one of an accumulated health (AH) of the electrical connection and a remaining usable life (RUL) of the electrical connection, calculating, based on the received input and usage associated with the vehicle, a first SOH value, calculating, based on the received input and behavior associated with the vehicle, a second SOH value, calculating, based on the first SOH value and the second SOH value, a third SOH value, the third SOH value being an indicator of the AH or the RUL of the electrical connection, and performing at least one action based on the third SOH value.

20 Claims, 11 Drawing Sheets

(56) References Cited

U.S. PATENT DOCUMENTS

| | | | | |
|---|---|---|---|---|
| 2005/0057865 A1* | 3/2005 | Veloo | H05K 1/0263 | |
| | | | 361/56 | |
| 2012/0158344 A1* | 6/2012 | Himmelstoss | G01R 31/66 | |
| | | | 702/108 | |
| 2013/0158755 A1* | 6/2013 | Tang | H01M 10/48 | |
| | | | 700/29 | |
| 2013/0158776 A1* | 6/2013 | Rini | B60R 16/0234 | |
| | | | 701/29.4 | |
| 2013/0293251 A1* | 11/2013 | Martin | B60L 3/0092 | |
| | | | 324/750.3 | |
| 2018/0115269 A1* | 4/2018 | Lin | G01R 31/007 | |
| 2023/0251324 A1* | 8/2023 | Malloy | B60L 3/12 | |
| | | | 702/63 | |

OTHER PUBLICATIONS

D. M. Williams, "Human factors affecting bolted busbar reliability," 2016 IEEE 62nd Holm Conference on Electrical Contacts (Holm), Clearwater Beach, FL, USA, 2016, pp. 86-93, doi: 10.1109/HOLM. 2016.7780012.

J. Martinez, A. Gomez-Pau, J.-R. Riba and M. Moreno-Eguilaz, "On-Line Health Condition Monitoring of Power Connectors Focused on Predictive Maintenance," in IEEE Transactions on Power Delivery, vol. 36, No. 6, pp. 3611-3618, Dec. 2021, doi: 10.1109/TPWRD. 2020.3045289.

J. Song, A. Shukla and R. Probst, "State of Health of Connectors—Early Indicators," 2022 IEEE 67th Holm Conference on Electrical Contacts (HLM), Tampa, FL, USA, 2022, pp. 1-7, doi: 10.1109/ HLM54538.2022.9969839.

M. Leidner, H. Schmidt and M. Myers, "Simulation of the Current Density Distribution within Electrical Contacts," 2010 Proceedings of the 56th IEEE Holm Conference on Electrical Contacts, Charleston, SC, USA, 2010, pp. 1-9, doi: 10.1109/HOLM.2010.5619467.

M. Myers, M. Leidner and H. Schmidt, "Effect of Contact Parameters on Current Density Distribution in a Contact Interface," 2011 IEEE 57th Holm Conference on Electrical Contacts (Holm), Minneapolis, MN, USA, 2011, pp. 1-9, doi: 10.1109/HOLM.2011. 6034783.

M. Sun, M. G. Pecht, M. A. E. Natishan and R. I. Martens, "Lifetime resistance model of bare metal electrical contacts," in IEEE Transactions on Advanced Packaging, vol. 22, No. 1, pp. 60-67, Feb. 1999, doi: 10.1109/6040.746544.

P. G. Slade, "Bus Bar Bolted Connections: Reliability and Testing," 2021 IEEE 66th Holm Conference on Electrical Contacts (HLM), San Antonio, TX, USA, 2021, pp. 209-216, doi: 10.1109/HLM51431. 2021.9671182.

R. S. Timsit, "A possible degeneration mechanism in stationary electrical contacts," in IEEE Transactions on Components, Hybrids, and Manufacturing Technology, vol. 13, No. 1, pp. 65-68, Mar. 1990, doi: 10.1109/33.52850.

R. S. Timsit, "Electrical instabilities in stationary contacts: Al/Al and Al/brass junctions," Electrical Contacts, 1988., Proceedings of the Thirty Fourth Meeting of the IEEE Holm Conference on Electrical Contacts, San Francisco, CA, USA, 1988, pp. 151-165, doi: 10.1109/HOLM.1988.16111.

* cited by examiner

P(L) = Limiting Performance Factor t(L) = Lifetime

STATE OF HEALTH MONITORING RESISTANCE TO POWERPACK

CROSS-REFERENCE TO RELATED APPLICATIONS

This application claims the benefit of U.S. Provisional Application No. 63/542,451, filed on Oct. 4, 2023. The entire disclosure of the application referenced above is incorporated herein by reference.

TECHNICAL FIELD

This disclosure relates to systems and methods for monitoring state of health of connections between a power source and an electric power steering (EPS) system.

BACKGROUND OF THE INVENTION

A vehicle, such as a car, truck, sport utility vehicle, crossover, mini-van, marine craft, aircraft, all-terrain vehicle, recreational vehicle, or other suitable forms of transportation, typically includes a steering system, such as an electronic power steering (EPS) system, a steer-by-wire (SbW) steering system, a hydraulic steering system, or other suitable steering system. The steering system of such a vehicle typically controls various aspects of vehicle steering including providing steering assist to an operator of the vehicle, controlling steerable wheels of the vehicle, and the like.

SUMMARY OF THE INVENTION

This disclosure relates generally to determining state of health of an electrical connection in a steering system of a vehicle.

A method for determining a state of health (SOH) of an electrical connection in a steering system of a vehicle includes, using a processor configured to execute instructions, receiving an input indicative of the SOH of the electrical connection, the input including a resistance associated with the electrical connection, and the SOH corresponding to at least one of an accumulated health (AH) of the electrical connection and a remaining usable life (RUL) of the electrical connection, calculating, based on the received input and usage associated with the vehicle, a first SOH value, calculating, based on the received input and behavior associated with the vehicle, a second SOH value, calculating, based on the first SOH value and the second SOH value, a third SOH value, the third SOH value being an indicator of the AH or the RUL of the electrical connection, and performing at least one action based on the third SOH value.

Other aspects of the disclosed embodiments include systems configured to perform steps and functions of the described methods.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1A:
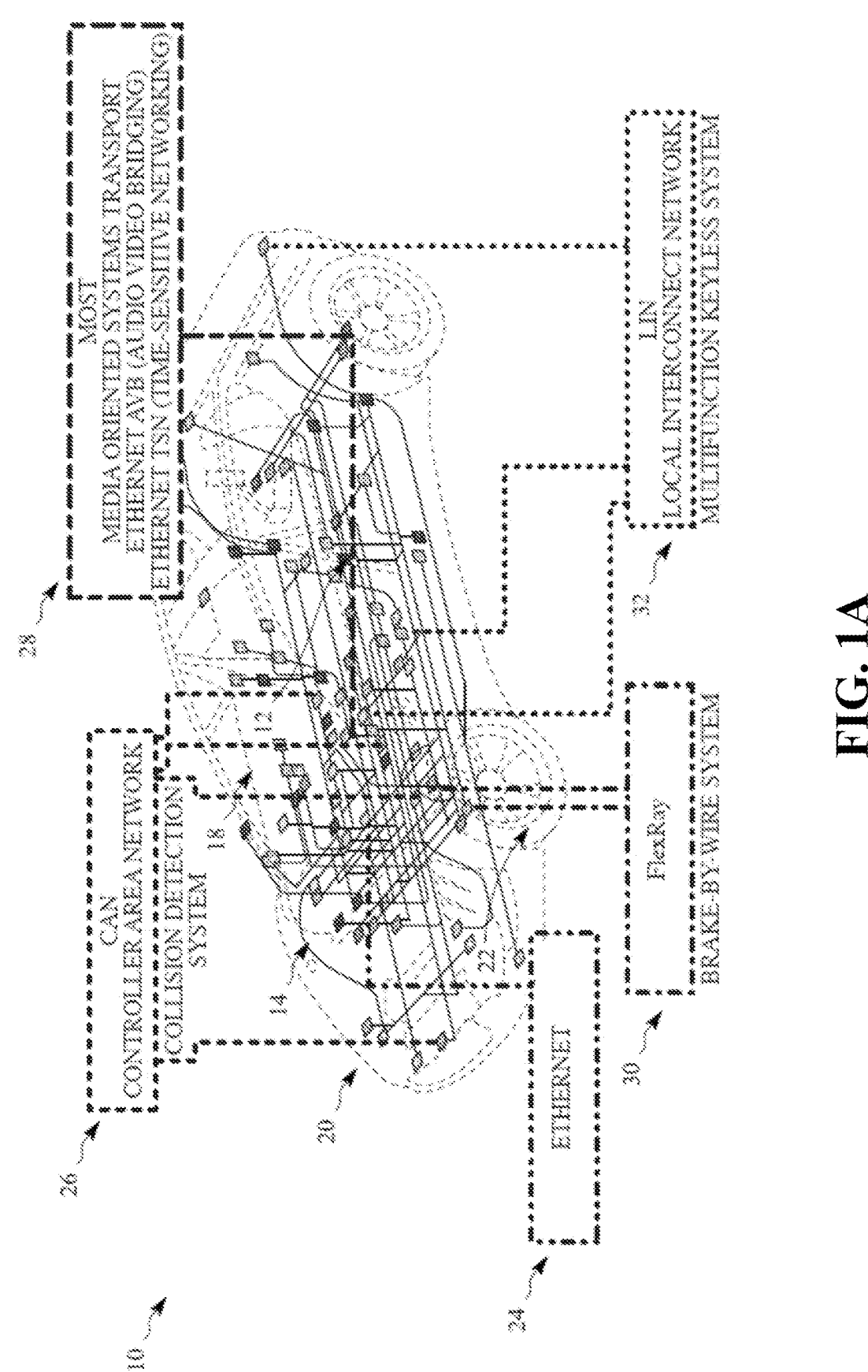
FIG. 1A generally illustrates a vehicle according to the principles of the present disclosure.

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, a vehicle, such as a car, truck, sport utility vehicle, crossover, mini-van, marine craft, aircraft, all-terrain vehicle, recreational vehicle, or other suitable forms of transportation, typically includes a steering system, such as an electronic power steering (EPS) system, a steer-by-wire (SbW) steering system, a hydraulic steering system, or other suitable steering system. The steering system of such a vehicle typically controls various aspects of vehicle steering including providing steering assist to an operator of the vehicle, controlling steerable wheels of the vehicle, and the like. Although described herein with respect to vehicles, the principles of the present disclosure may also be implemented in other types of transportation or non-transportation apparatuses including steering systems.

The vehicle typically includes one or more electric machines, such as electric motors configured to control various aspects of a steering system of the vehicle. A high power electrical harness and connector may supply electrical power from a vehicle electrical system (e.g. battery and/or alternator) to a motor controller for one or more motors of the steering system. Over the life of the vehicle, the high power connection properties may degrade, resulting in eventual loss of input power sufficient to deliver the desired electromechanical output power to provide the steering assist or steering angle function. This degradation is observable as an effective increase in the resistance of the power connector or harness. When attempting to deliver this electromechanical output power, the supply current draw through the increased resistance of the high power connection or harness will cause a large voltage drop between the vehicle supply and the motor controller, which may cause the total voltage at the motor controller input to be low enough to result in a "turn off" or "drop from operate state,"

which may result in loss of function, such as loss of assist in an EPS system, and/or loss of angle control in an advanced driver-assistance system (ADAS) or SbW system. In some examples, even if the motor controller input does not turn off, a reduced available power may result in lower torque assist, lagging response, poor feedback, reduced angle control, and overall reduced steering performance.

In some embodiments, it is desirable to detect this degraded condition and/or to limit an electromechanical output power command based on detecting this degraded condition in order to reduce the required input power and prevent loss of function of the steering system, such as loss of assist in an EPS system, or loss of angle control in an ADAS or SbW system. While performance may be reduced, this may be preferable to alternatives, which could include a full loss of the assist or angle control function.

Some systems may implement techniques to determine degradation of the input power connection (or harness) using available signals within the existing control module and software. An example system for determining power connection degradation is described in more detail in U.S. patent application Ser. No. 17/733,434, filed on Apr. 29, 2022, the entire contents of which are incorporated herein by reference. In this example, electric power is applied to the motor phases and the response is measured. The power applied is V*I, where V and I are vector quantities of applied motor voltage and motor current, respectively. In some examples, the electric power applied is selected to produce zero motor torque. For example, for EPS systems, a sinusoidal, non-torque producing current is applied to the motor phases. For ADAS and SbW systems, a sinusoidal, non-torque producing or a torque producing current may be applied. The measurement of the response (e.g., a voltage, such as a bridge voltage, measured at a control module input) is indicative of degradation and SOH of the input power connection.

In some examples, determining the SOH of the connection may include determining an accumulated health (AH), a remaining usable life (RUL) of the connection, or other SOH prognostic indicator. For example, the AH may correspond to a percentage, such as a percentage of remaining life or usage, and the RUL may correspond to time period, such as a remaining life time period. Determination of AH and RUL may be performed based on usage (e.g., based on a usage-based model configured to calculate AH and/or RUL as a function of usage) or behavior (e.g., based on one or more measurements of driver behavior, such as sensor and/or derived signal measurements, vehicle behavior and/ or characteristics, etc.). For example, usage may be calculated based on miles traveled, hours of operation, detected current, current used, vibration, time at temperature, etc. As used herein, "SOH" may collectively refer to AH, RUL, and/or other SOH indicators.

Determining AH and RUL based on either usage or behavior alone may not provide an accurate SOH of the connection. For example, providing accurate AH and RUL may be more critical nearer to an end of life of the connection. However, for usage-based calculations, unmeasured or unpredictable factors, such as unmeasured environmental factors, may cause drastically different results for a same usage profile near end of life. Conversely, behavior-based calculations that use measurement data to estimate health may be less accurate early in the life of the connection and more accurate near the end of life of the connection. For example, measurements used in behavior-based calculations may have a non-linear relationship with connection degradation and therefore only provide accurate results near the end of life of the connection.

Accordingly, SOH monitoring systems and methods according to the present disclosure are configured to calculate AH and RUL using a combination of usage-based and behavior-based techniques. Two separate periods of time are used to demonstrate differences between results of usage-based and behavior-based techniques. In one example, during a first (e.g., "early-life") period of the life of the connection, usage-based techniques may be applied to calculate AH and/or RUL. Conversely, during a second (e.g., "late-life") period of life of the connection, behavior-based techniques may be applied to calculate AH/RUL. In other words, usage-based techniques are used to calculate AH/RUL in the first period where behavior-based techniques are not yet able to detect degradation of the connection while behavior-based techniques are used to calculated AH/RUL in the second period where usage-based techniques are less accurate. Various techniques for combining usage-based and behavior based calculation techniques for AH and RUL are described herein. Although described with respect to two periods of time/life of the connection, in some examples more than two periods of time may be used with different mechanisms, weighting, etc., dependent upon different failure modes relevant to different factors during the period of life of the connection.

Further, while described with respect to steering systems, the principles of the present disclosure may be implemented in other types of vehicle or non-vehicle systems comprising a motor and actuator (e.g., a windshield wiper system, propulsion system, window controller, etc.).

FIG. 1A generally illustrates a vehicle 10 according to the principles of the present disclosure. The vehicle 10 may include any suitable vehicle, such as a car, a truck, a sport utility vehicle, a mini-van, a crossover, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles.

The vehicle 10 includes a vehicle body 12 and a hood 14. A passenger compartment 18 is at least partially defined by the vehicle body 12. Another portion of the vehicle body 12 defines an engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position. In some embodiments, the engine compartment 20 may be disposed on rearward portion of the vehicle 10 than is generally illustrated.

The passenger compartment 18 may be disposed rearward of the engine compartment 20, but may be disposed forward of the engine compartment 20 in embodiments where the engine compartment 20 is disposed on the rearward portion of the vehicle 10. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system.

In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a handwheel, and other such components are disposed in the passenger compartment 18 of the vehicle 10. The propulsion controls may be actuated or controlled by an operator of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system. As such, in some embodiments, the vehicle 10 may be an autonomous vehicle.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force, which is translated through the transmission to one or more axles, which turns wheels 22. When the vehicle 10 includes one or more electric motors, a vehicle battery, and/or fuel cell provides energy to the electric motors to turn the wheels 22.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

In some embodiments, the vehicle 10 may include an Ethernet component 24, a controller area network (CAN) bus 26, a media oriented systems transport component (MOST) 28, a FlexRay component 30 (e.g., brake-by-wire system, and the like), and a local interconnect network component (LIN) 32. The vehicle 10 may use the CAN bus 26, the MOST 28, the FlexRay Component 30, the LIN 32, other suitable networks or communication systems, or a combination thereof to communicate various information from, for example, sensors within or external to the vehicle, to, for example, various processors or controllers within or external to the vehicle. The vehicle 10 may include additional or fewer features than those generally illustrated and/or disclosed herein.

In some embodiments, although not shown, the vehicle 10 may include a steering system, such as an EPS system, a steering-by-wire steering system (e.g., which may include or communicate with one or more controllers that control components of the steering system without the use of mechanical connection between the handwheel and wheels 22 of the vehicle 10), a hydraulic steering system (e.g., which may include a magnetic actuator incorporated into a valve assembly of the hydraulic steering system), or other suitable steering system.

The steering system may include an open-loop feedback control system or mechanism, a closed-loop feedback control system or mechanism, or combination thereof. The steering system may be configured to receive various inputs, including, but not limited to, a handwheel position, an input torque, one or more roadwheel positions, vehicle speed, temperature, other suitable inputs or information, such as any signals available on a vehicle communication bus, or a combination thereof.

Additionally, or alternatively, the inputs may include a handwheel torque, a handwheel angle, a motor velocity, a vehicle speed, an estimated motor torque command, other suitable input, or a combination thereof. The steering system may be configured to provide steering function and/or control to the vehicle 10. For example, the steering system may generate an assist torque based on the various inputs. The steering system may be configured to selectively control a motor of the steering system using the assist torque to provide steering assist to the operator of the vehicle 10. The steering system of the present disclosure is configured to implement SOH monitoring systems and methods as described below in more detail.

Figure 1B:
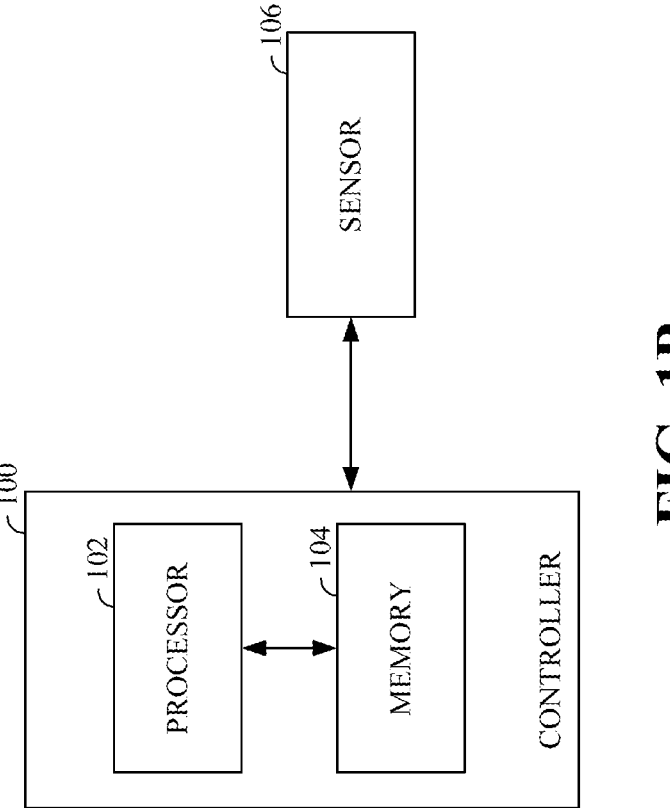
FIG. 1B generally illustrates a controller according to the principles of the present disclosure.

In some embodiments, the vehicle 10 may include a controller, such as controller 100, as is generally illustrated in FIG. 1B. The controller 100 may include any suitable controller, such as an electronic control unit or other suitable controller. The controller 100 may be configured to control, for example, the various functions of the steering system and/or various functions of the vehicle 10. The controller 100 may include a processor 102 and a memory 104. The processor 102 may include any suitable processor, such as those described herein. Additionally, or alternatively, the controller 100 may include any suitable number of processors, in addition to or other than the processor 102. The memory 104 may comprise a single disk or a plurality of disks (e.g., hard drives), and includes a storage management module that manages one or more partitions within the memory 104. In some embodiments, memory 104 may include flash memory, semiconductor (solid state) memory or the like. The memory 104 may include Random Access Memory (RAM), a Read-Only Memory (ROM), or a combination thereof. The memory 104 may include instructions that, when executed by the processor 102, cause the processor 102 to, at least, control various aspects of the vehicle 10. Additionally, or alternatively, the memory 104 may include instructions that, when executed by the processor 102, cause the processor 102 to perform functions associated with the systems and methods described herein.

The controller 100 may receive one or more signals from various measurement devices or sensors 106 indicating sensed or measured characteristics of the vehicle 10. The sensors 106 may include any suitable sensors, measurement devices, and/or other suitable mechanisms. For example, the sensors 106 may include one or more torque sensors or devices, one or more handwheel position sensors or devices, one or more motor position sensor or devices, one or more position sensors or devices, other suitable sensors or devices, or a combination thereof. The one or more signals may indicate a handwheel torque, a handwheel angle, a motor velocity, a vehicle speed, other suitable information, or a combination thereof.

As used herein, "controller" may refer to a hardware module or assembly including one or more processors or microcontrollers, memory, sensors, one or more actuators, a communication interface, etc., any portions of which may be collectively referred to as "circuitry." As described herein, respective functions and steps performed by a given controller, control circuitry, etc. may be collectively performed by multiple controllers, processors, etc. For example, a processor, processing device, controller, control circuitry, etc. "configured to perform" may refer to a single processor, processing device, controller, etc. configured to perform both A and B or may refer to a first processor, processing device, controller, etc. configured to perform A and a second processor, processing device, controller, etc. configured to perform B. For simplicity, "control circuitry configured to perform A and B" may refer to a single or multiple processors, processing devices, controllers, etc. collectively configured to perform A and B. In some examples, one or more functions may be performed remotely (e.g., relative to the vehicle), such as at a controller, processor, circuitry, etc. of a remote server, cloud computing system, and/or other remote processing system.

In some embodiments, the controller 100 may perform the methods described herein. However, the methods described herein as performed by the controller 100 are not meant to be limiting, and any type of software executed on a controller or processor can perform the methods described herein without departing from the scope of this disclosure. For example, a controller, such as a processor executing software within a computing device, can perform the methods described herein.

Figure 2:
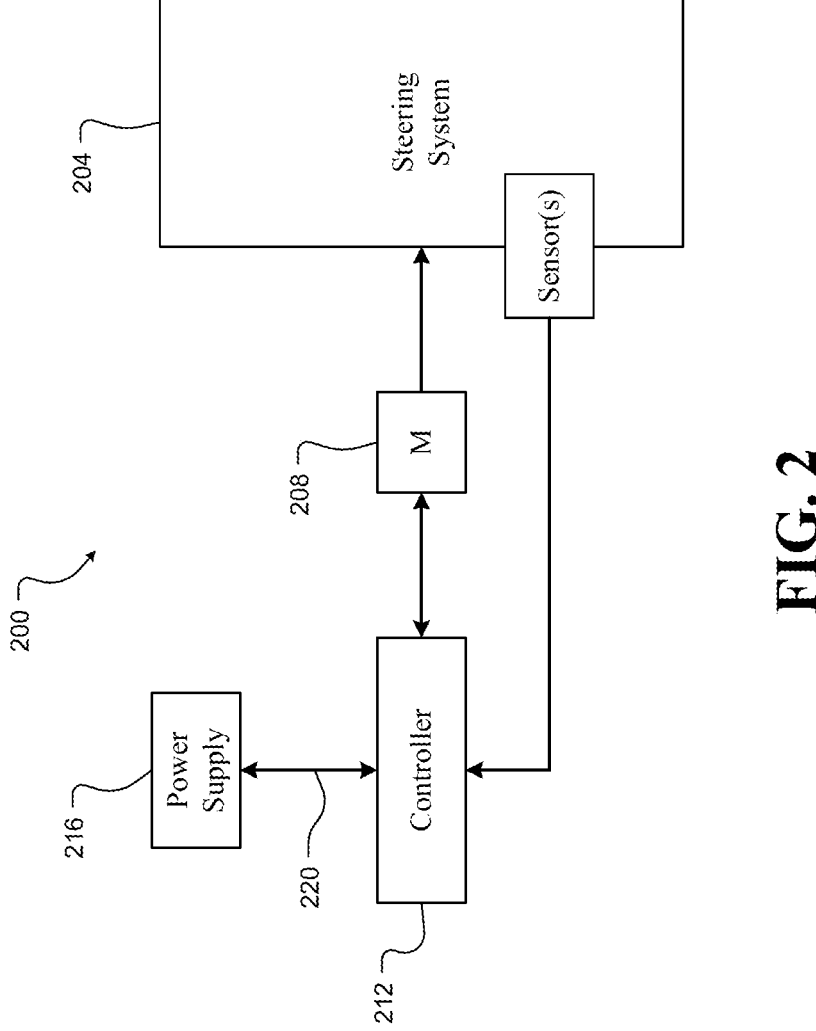
FIG. 2 generally illustrates, schematically, an example electronic power steering (EPS) system according to the principles of the present disclosure.

FIG. 2 generally illustrates, schematically, an example EPS system 200 according to the principles of the present disclosure. Although described with respect to an EPS system, the principles of the present disclosure may be implemented with other types of steering systems, such as SbW and ADAS systems, as well as non-steering systems.

The EPS system 200 includes a steering system 204. Details of the steering system 204 are omitted for simplicity. For example, the steering system 204 may include a rack-and-pinion type steering mechanism responsive to operator input (e.g., a steering wheel, hand wheel, etc.). In some examples, steering assist may be provided via an electric machine, such as a motor 208 (e.g., a permanent magnet synchronous motor).

The motor 208 is responsive to a controller or control circuitry 212, which receives power to control the motor 208 from a power supply 216 (which may include a battery, alternator, etc.) via a wiring harness 220. Although shown for simplicity as a single connection between the power supply 216 and the controller 212, the wiring harness 220 may include multiple wired connections to various components of the EPS system 200, such as one or more direct connections to the motor 208. The wiring harness 220 may include one or more conductors, such as lengths of wire, bus bars, etc. In some examples, the wiring harness 220 includes one or more connectors, such as spade connectors, receptacles, plugs, lugs, wiring terminals, etc. Further, although described with respect to a single controller 212, the EPS system 200 may include a plurality of controllers, each having different connections between the controller and the power supply 216, a respective motor, etc., and SOH, AH, and RUL may be calculated in accordance with the principles of the present disclosure for electrical connections of respective controllers, motors, etc.

The controller 212 receives various measurement signals from respective sensors, including, but not limited to, one or more sensors 224 configured to generate measurement signals associated with the steering system 204, along with vehicle state information (vehicle speed, mileage, temperature, etc.) received through a vehicle communication bus. The measurement signals may include a steering angle (e.g., measured by a position sensor) and motor velocity. A motor velocity denoted $\omega\_m$ may be measured, calculated, or a combination thereof. For example, the motor velocity $\omega\_m$ may be calculated as the change of a motor position $\theta$ as measured by a position sensor over a prescribed time interval. For example, motor velocity $\omega\_m$ may be determined as the derivative of the motor position $\theta$ from the equation $\omega\_m = \Delta\theta/\Delta t$, where $\Delta t$ is a sampling time and $\Delta\theta$ is a change in position during the sampling interval. Alternatively, motor velocity may be derived from motor position as the time rate of change of position.

The controller 212 controls the motor 208 to supply torque assist to the steering system 204 based on various inputs, measurement signals, etc. For example, the controller 212 is configured to supply corresponding voltages to the motor 208 via an inverter (not shown), which may optionally be incorporated within the controller 212, to cause the motor 208 to generate a desired torque and/or position.

The wiring harness 220 have an associated resistance (e.g., a harness resistance) representing resistance of electrical components in a path of current flow between the power supply 216 and an input to the controller 212 (including paths both to and from the controller 212). For example, the harness resistance has a harness resistance value $R_{harness}$, which is a sum of resistances of the wiring harness 220, vehicle ground, and one or more connectors or connections. Over time, these connections can erode and/or degrade and cause a total path resistance between the power supply 216 and the controller 212 to increase. Accordingly, degradation of the connections can be determined based on the harness resistance.

Figure 3:
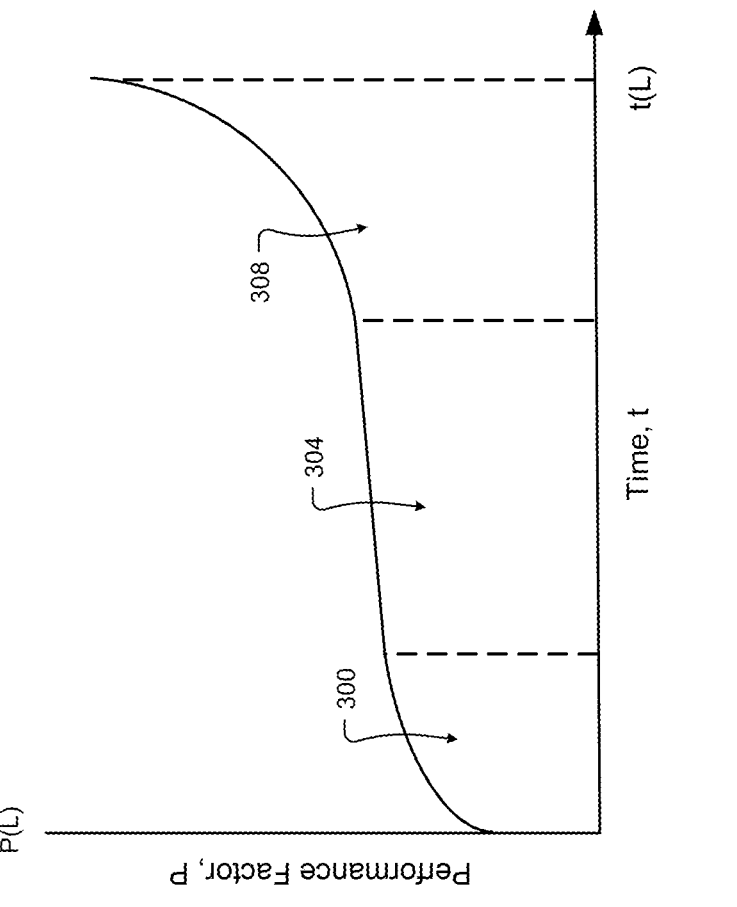
FIG. 3 generally illustrates example degradation of over a lifetime of an electrical connection.

FIG. 3 illustrates example degradation of a performance factor P (e.g., for a limiting performance factor P (L)) over a lifetime t (L) of an electrical connection. Subsequent to a formation period shown at 300, performance is relatively stable (i.e., relatively flat) for a period 304 before experiencing accelerated aging and degradation of performance in a period 308. Accordingly, while resistance may generally indicate degradation, resistance alone may not accurately indicate AH and RUL. While shown generally increasing within the period 300, the performance factor P may vary (e.g., increase, decrease, etc.) within the period 300. For example, the period 300 may correspond to a "setting in" period in which various components, materials, connections, etc. stabilize subsequent to installation.

Figure 4:
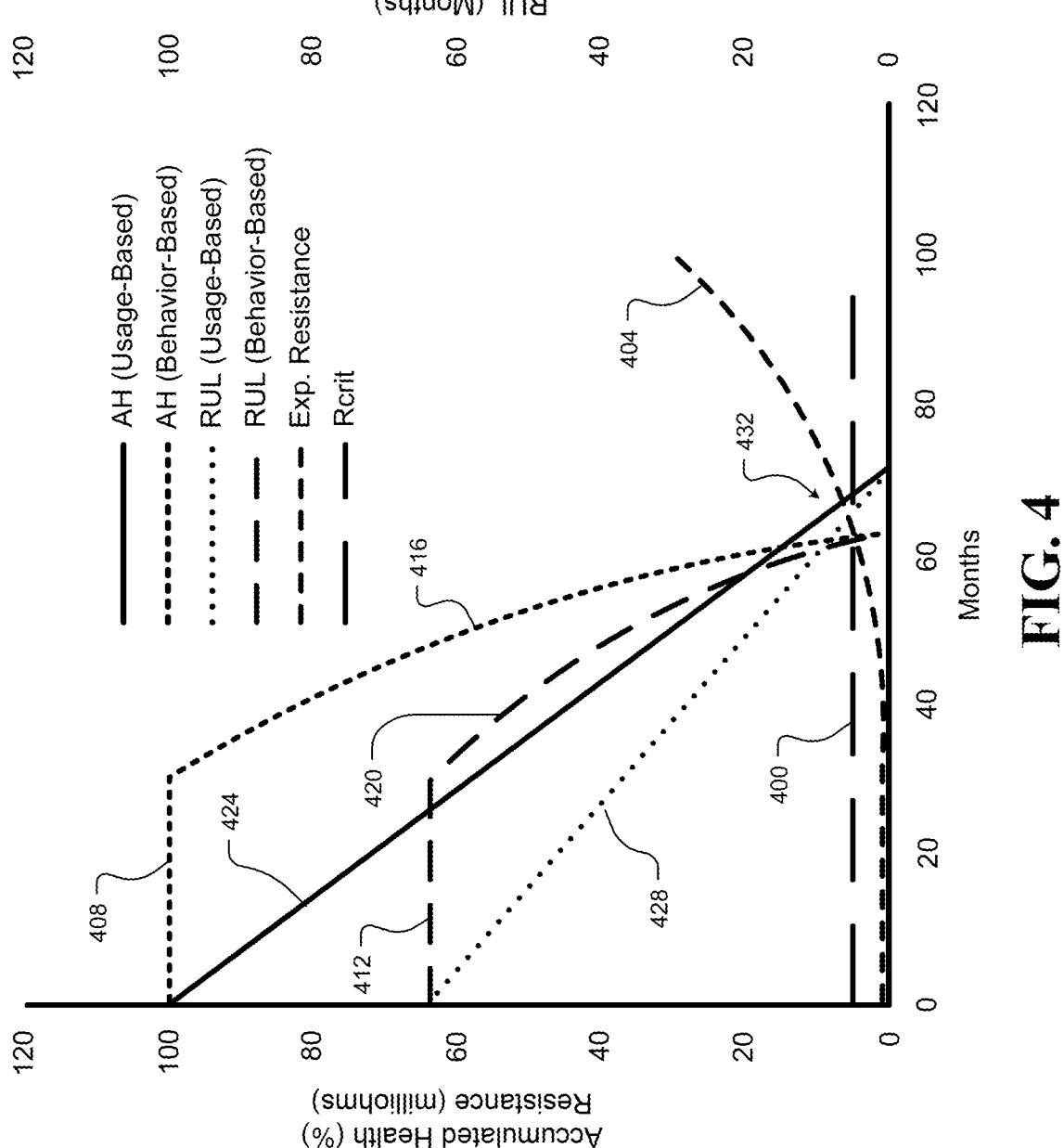
FIG. 4 generally illustrates examples of accumulated health (AH) and remaining usable life (RUL) calculated with usage-based techniques and behavior-based techniques.

FIG. 4 illustrates examples of AH calculated with usage-based techniques, AH calculated with behavior-based techniques, RUL calculated with usage-based techniques, RUL calculated with behavior-based techniques, and measured resistance (exponential resistance). For reference, an example critical resistance is shown at 400. As used herein, the critical resistance 400 is selected to indicate a resistance value at which significant degradation of the electrical connection has occurred (e.g., sufficient degradation to cause performance degradation noticeable to the driver). Further, upon reaching the critical resistance 400, the measured resistance may begin to increase exponentially as shown at 404, indicating accelerated aging.

In different examples, the critical resistance may be set based on different metrics, including, but not limited to: based on when the resistance begins to exponentially increase; based on when the resistance reaches a calibratable predetermined resistance (e.g., 20 milliohms) that is known to cause significant performance degradation; based on when the resistance is a multiple of (e.g., 1.5 times, 2 times, etc.) a lowest ever known resistance value (i.e., historically) at which significant degradation has occurred from a stable baseline condition; and based on when the resistance is within a predetermined or variable range of a critical value at which service would be required.

Accordingly, SOH techniques may calculate AH and RUL to attempt to predict a time at which the measured resistance will reach or exceed a selected critical resistance. As described herein, the measured resistance may be obtained using various techniques, such as by applying a sinusoidal current, measuring a response (e.g., a voltage response) at one or more inputs, and calculating a resistance based on the current and measured response as described in U.S. patent application Ser. No. 17/733,434 incorporated by reference herein.

As shown at 408 and 412, respectively, behavior-based techniques do not accurately indicate AH and RUL during a first, early life period (e.g., prior to 30 months). However, as shown at 416 and 420, respectively, behavior-based techniques begin to more accurately indicate AH and RUL in a second, later life period (e.g., subsequent to 30 months). In other words, since resistance and other behavior-based measured, calculated, or estimated values may be relatively flat or constant during the early life period, behavior-based techniques do not accurately indicate AH and RUL in the early life period.

Conversely, as shown at 424 and 428, respectively, usage-based techniques result in generally linear calculations of AH and RUL. In other words, since usage-based techniques may be at least partly based on usage time, AH and RUL as calculated in accordance with usage-based techniques will generally decrease as usage increases. However, since degradation is not linear and tends to accelerate near end of life, the generally linear results of usage-based techniques are less accurate near end of life. For example, as shown at 432, the usage-based results indicate AH and RUL values that exceed corresponding AH and RUL values for the behavior-based results, and exceed the point at which the measured resistance reaches or exceeds the selected critical resistance.

FIGS. 5A-5E illustrate various example AH calculation methods configured to implement combinations of usage-based and behavior-based techniques according to the principles of the present disclosure. Although described with respect to AH calculation, the principles described in FIGS. 5A-5E may also be implemented for RUL calculation. As described herein, combinations of usage-based and behavior-based techniques according to the principles of the present disclosure may be referred to as blended techniques, hybrid techniques, combination techniques, etc.

In examples described below, both usage-based and behavior-based techniques are calculated and merged/combined. However, simply combining usage-based and behavior-based techniques may cause ambiguous or incongruous results (e.g., AH and/or RUL values becoming fixed for long periods of time, sharply increasing or decreasing, etc.). Various examples for obtaining consistent and accurate AH and/or RUL values over a lifetime of an electrical connection using a combination of usage-based and behavior-based techniques are provided in the below examples.

Figure 5A:
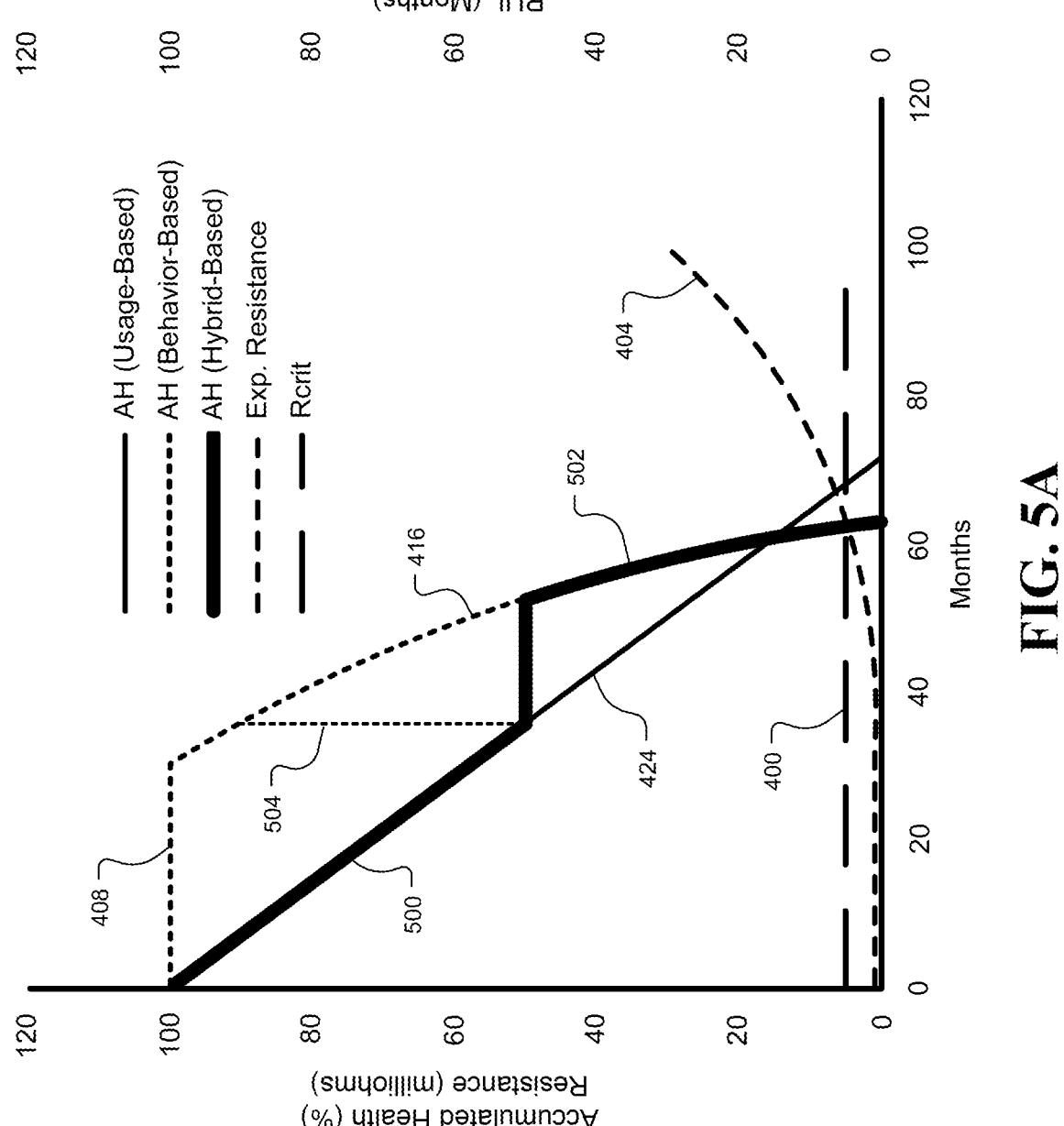
FIGS. 5A-5E generally illustrate various example AH calculation methods according to the principles of the present disclosure.

FIG. 5A illustrates a first example of a combination of usage-based and behavior-based techniques (e.g., a first "hybrid-based" technique). In this example, usage-based techniques are used for a first period. Accordingly, for the first period, results of the first hybrid-based technique as shown at 500 correspond to the generally linear usage-based results as shown at 424. Conversely, behavior-based techniques are used for a second period. Accordingly, for the second period, results of the first hybrid-based technique as shown at 502 correspond to the behavior-based results as shown at 416. In this manner, results of the first hybrid-based technique provide the accuracy of usage-based techniques in the early life period of the electrical connection and the accuracy of behavior-based techniques in the later life period of the electrical connection.

Various techniques may be used for transitioning between the usage-based and behavior based techniques. For example, if results of the first hybrid-based technique simply transitioned directly to behavior-based techniques at the end of a selected first period, the results of the first hybrid-based technique would simply spike upward as shown at 504. To avoid this outcome, the results of the first hybrid-based technique may be maintained at a value corresponding to the transition from the first period to the second period as shown at 506. For example, the results of the first hybrid-based technique may be maintained at the value 506 until the results of the behavior-based technique "catch up" to (i.e., decrease to the same value as) the usage-based technique. In this example, the results of the first hybrid-based technique are maintained at 50% until the results of the behavior-based technique also reaches 50% and then begin to follow the results of the behavior-based technique for the remainder of the life of the electrical connection, which may result in AH and/or RUL values becoming fixed or frozen for long periods of time.

Transition between the first period and the second period (i.e., between use of the usage-based technique and the behavior-based technique) may be time-based, measurement based, or combinations thereof. For example, as shown, the transition may be performed based on obtained AH values for the usage-based technique. In this example, the results of the first hybrid-based technique are maintained/held at a threshold AH (here, 50%) until the results of the behavior-based technique also reach 50%. In other examples, other thresholds may be used.

Figure 5B:
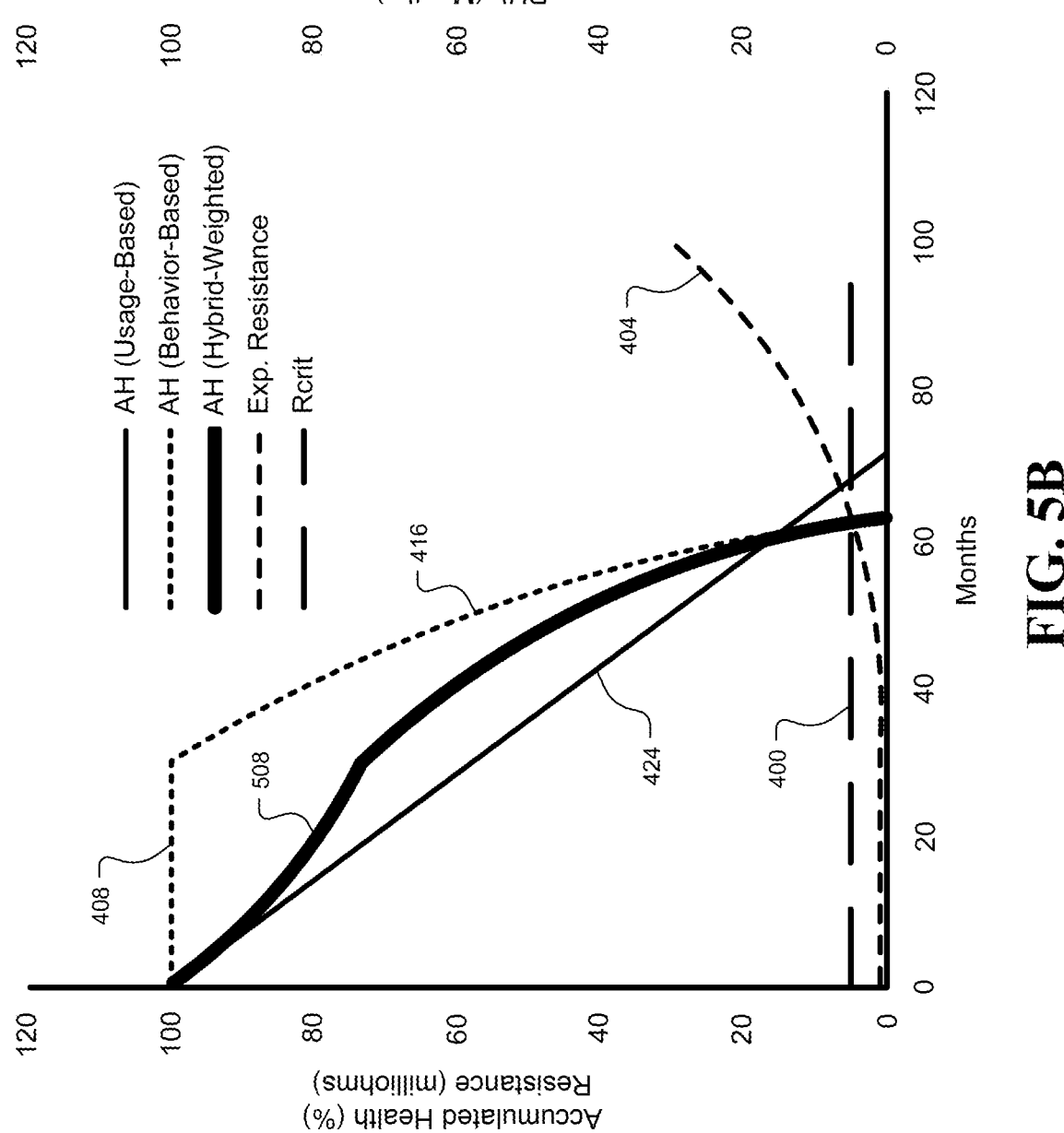

FIG. 5B illustrates a second example of a combination of usage-based and behavior-based techniques (e.g., a second "hybrid-based" technique, which may be referred to as a "hybrid-weighted" technique). Results of the second hybrid-based technique are shown at 508. In this example, a blending or combining technique is used to calculate a combination of the results of the usage-based technique and the behavior-based technique. For example, the results of the second hybrid-based technique may correspond to an average or weighted average of the usage-based technique and the behavior-based technique.

In an example, the second hybrid-based technique may be configured such that the results of the second hybrid-based technique are increasingly weighted toward the results of the behavior-based technique as usage and/or time increase. For example, during a period corresponding to the generally "flat" results of the behavior-based technique shown at 408, results of the usage-based technique may be weighted at greater than 50% in the calculation of the results of the second hybrid-based technique. Conversely, during a period corresponding to decreasing results of the behavior-based technique shown at 416, results of the results of the usage-based technique may be weighted at less than 50% while results of the behavior-based technique may be weighted at greater than 50%. In one example, for a weighted-average calculation, the results of the usage-based technique are assigned an initial maximum weight (e.g., 100%, 90% etc.) that decreases (linearly or nonlinearly, step-wise, etc.) as months of usage increase, as AH decreases, etc. Conversely, the results of the usage-based technique are assigned an initial minimum weight (e.g., 0%, 10%, etc.) that decreases (linearly or nonlinearly, step-wise, etc.) as months of usage increase.

Figure 5C:
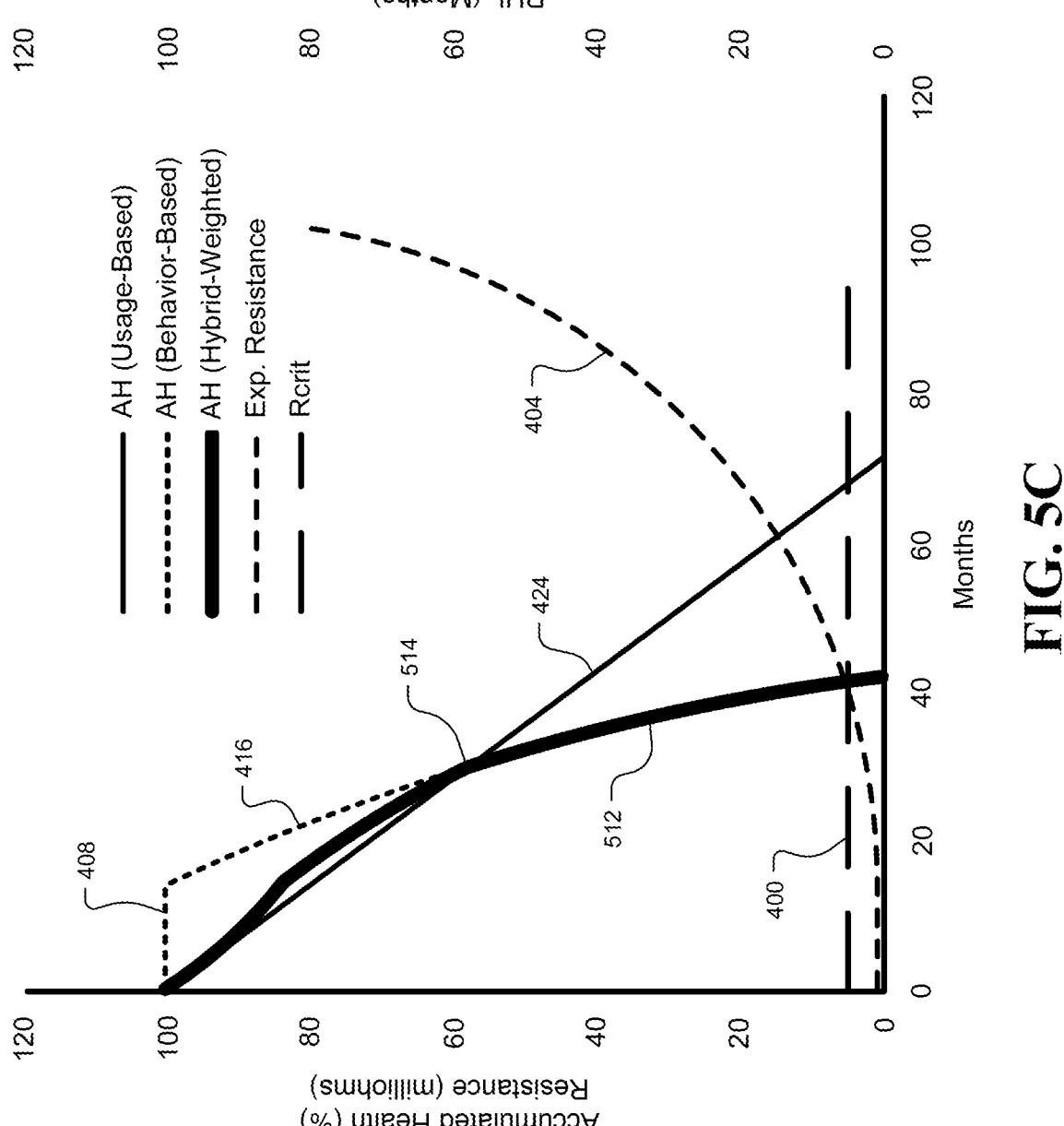

FIG. 5C illustrates a third example of a combination of usage-based and behavior-based techniques (e.g., a third "hybrid-based" technique, which may be referred to as a "hybrid-weighted" technique). Results of the third hybrid-based technique are shown at 512. In this example, a blending or combining technique similar to the hybrid-weighted technique described above with respect to FIG. 5B is used to calculate a combination of the results of the usage-based technique and the behavior-based technique. For example, the results of the third hybrid-based technique may correspond to an average or weighted average of the usage-based technique and the behavior-based technique. However, in this example, the results of the third hybrid-based technique are configured to transition completely to results of the behavior-based technique in response to a determination that the results of the behavior-based technique are less than results of the usage-based technique as shown at 514. In other words, the results of the third hybrid-based technique correspond to an average or weighted average of the usage-based technique and the behavior-based technique until results of the behavior-based technique are less than results of the usage-based technique. In some examples, the transition to using the results of the behavior-based technique may be based on other values and comparisons, such as transitioning in response to a determination that the results of the behavior-based technique are within a threshold of (e.g., within 10% of) the results of the usage-based technique.

For example, as shown in FIG. 5C, results of the behavior-based technique begin to decrease much earlier (i.e., in months) than in previous examples (e.g., due to the measured resistance 404 and/or other indicators of degradation increasing more rapidly than in previous examples). Accordingly, continuing to use an average or weighted-average of the usage-based technique and the behavior-based technique subsequent to the point indicated at 514 would cause the results third hybrid-based technique to inaccurately indicate a greater AH (or RUL). The third hybrid-based technique corrects this inaccuracy.

Figure 5D:
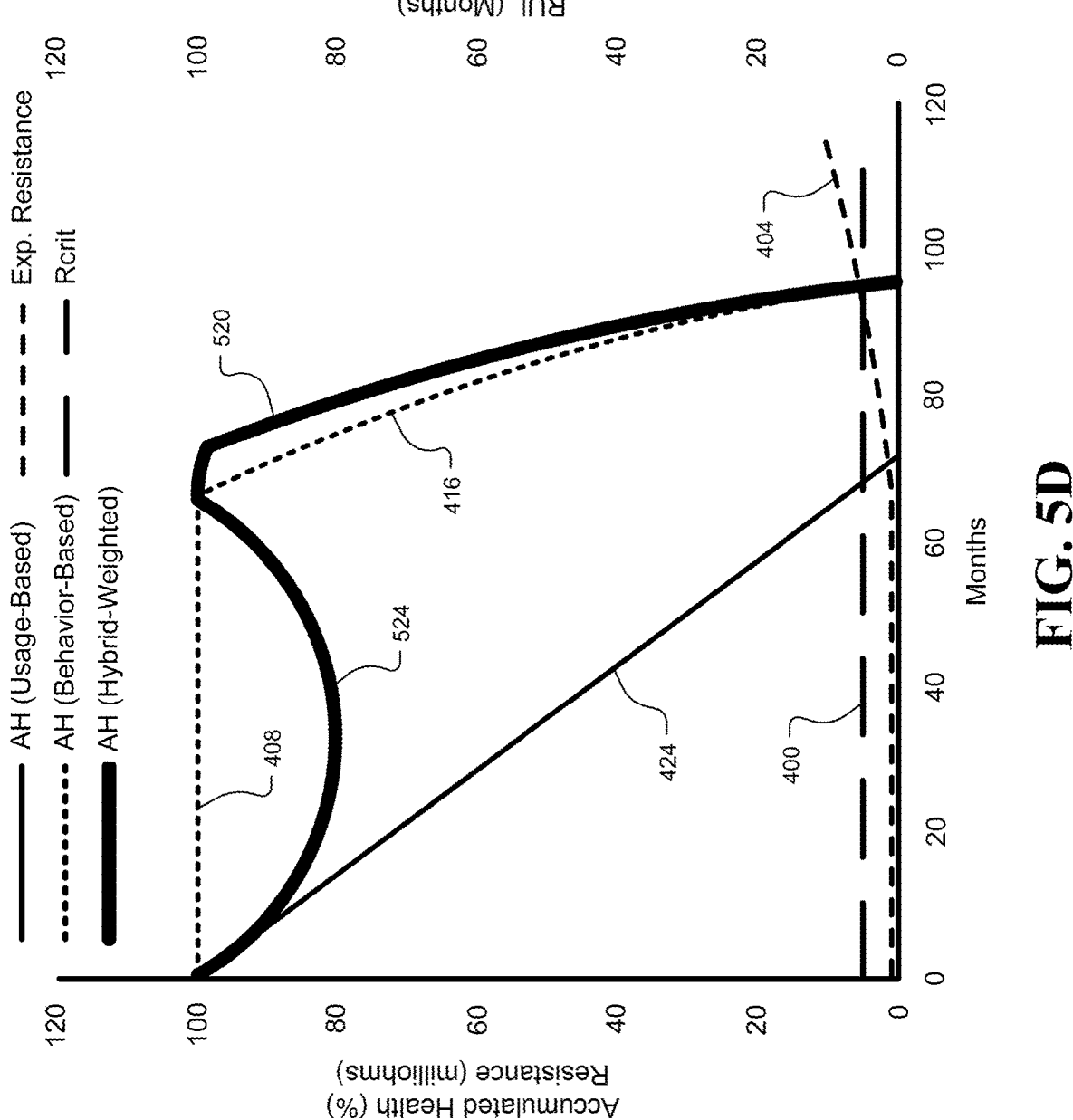

FIG. 5D illustrates another example of results of the third hybrid-based technique. The results of the third hybrid-based technique in this example are shown at 520. In this example, results of the behavior-based technique begin to decrease much later (i.e., in months) than in previous examples (e.g., due to the measured resistance 404 and/or other indicators of degradation increasing more slowly than in previous examples). Accordingly, using an average or weighted-average of the usage-based technique and the behavior-based technique during the entire period of the relatively long "flat" region of the results of the behavior-based technique as shown at 408 results in an upward curve in the results (a "curve-up" event) as shown at 522. The upward curve 522 is caused by the increasing weight applied to the results of the behavior-based technique as time passes and the flat region 408 lengthens while the results of the usage-based technique decrease relatively quickly. For example, as the results of the usage-based technique decrease, the weighted average shifts away from the results of the usage-base technique and toward the results of the behavior-based technique, causing the upward curve 522.

Figure 5E:
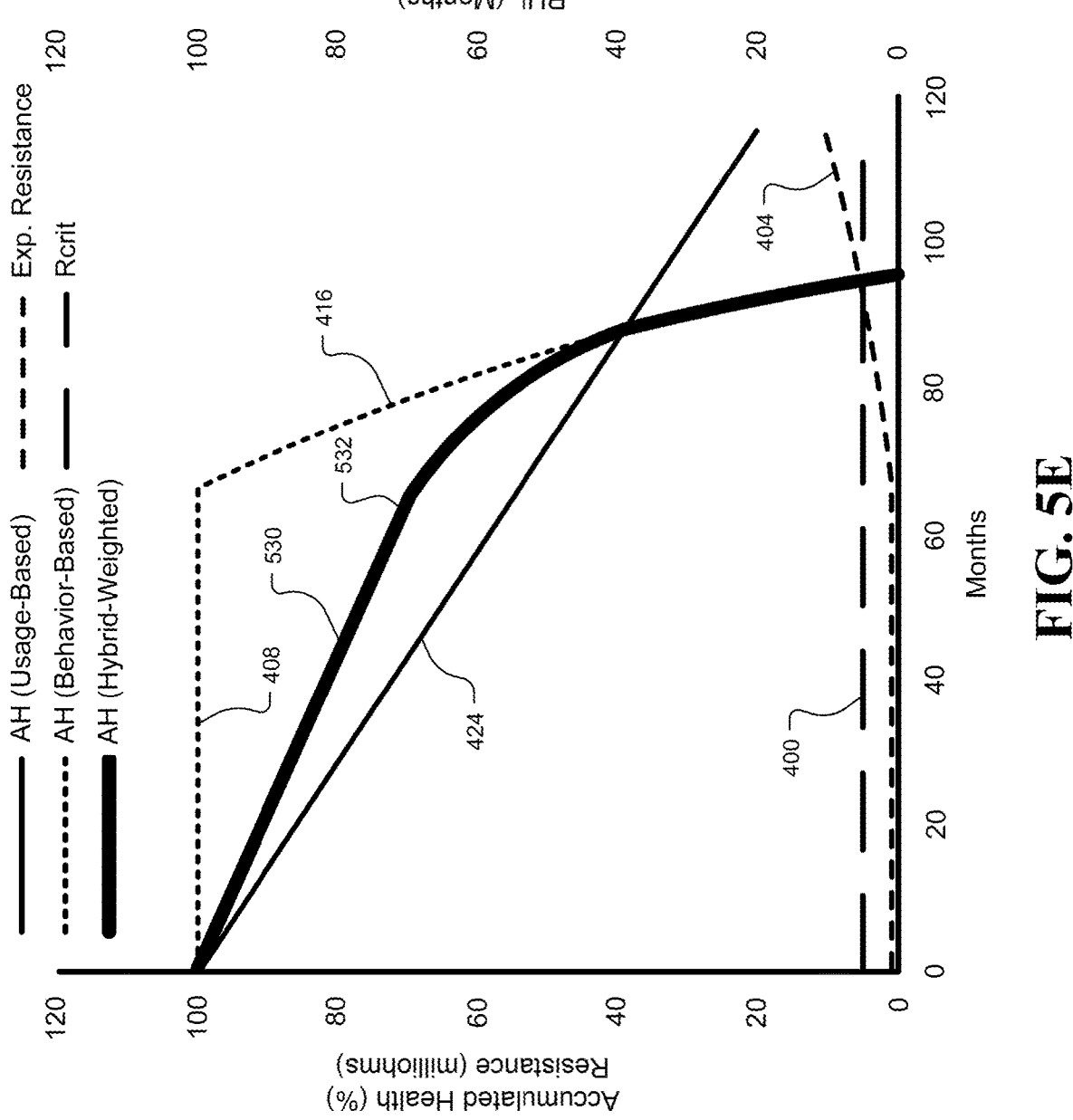

FIG. 5E illustrates a fourth example of a combination of usage-based and behavior-based techniques (e.g., a fourth "hybrid-based" technique, which may be referred to as a "hybrid-weighted" technique) configure to minimize or eliminate the upward curve 522. Results of the fourth hybrid-based technique are shown at 530. The fourth hybrid-based technique modifies the third hybrid-based technique by extending the results of the usage-based model beyond a typical estimated lifespan of the electrical connection. For example, in previous examples, a usage-based model may be configured to generate results based in part on a typical estimated lifespan of the electrical connections, such as 70-80 months or longer. A typical estimated lifespan may be significantly longer than 80 months and these values are selected only for illustration purposes. This configuration is indicated in the results of the usage-based techniques shown at 424 in each of FIGS. 5A-5D.

Conversely, as shown in FIG. 5E, the usage-based technique is configured to generate results based on an estimated lifespan (e.g., a modified estimated lifespan) that is much longer than the typical estimated lifespan. In some examples, the modified estimated lifespan is 1.5 times, 2 times, 2.5 times, etc. the typical estimated lifespan. As shown, using the modified estimated lifespan causes the results of the usage-based technique to extend past 120 months. Accordingly, the fourth hybrid-based technique compensates for conditions that could cause the upward curve 522 shown in FIG. 5D.

For example, since the shift in the weighted average is determined based on the results of the usage-based technique, maintaining the results of the usage-based technique at a higher value for a longer period prevents the upward curve 522. In an example, the transition to assigning a higher weight to the results of the behavior-based technique than to the results of the usage-based technique may occur in response to the AH of the results of the usage-based technique decreasing below 50%. Since this decrease below 50% occurs later relative to the example shown in FIG. 5D, the results of the fourth hybrid-based technique continue to be more heavily weighted toward the results of the usage-based technique (e.g., until a point indicated at 532).

Figure 6:
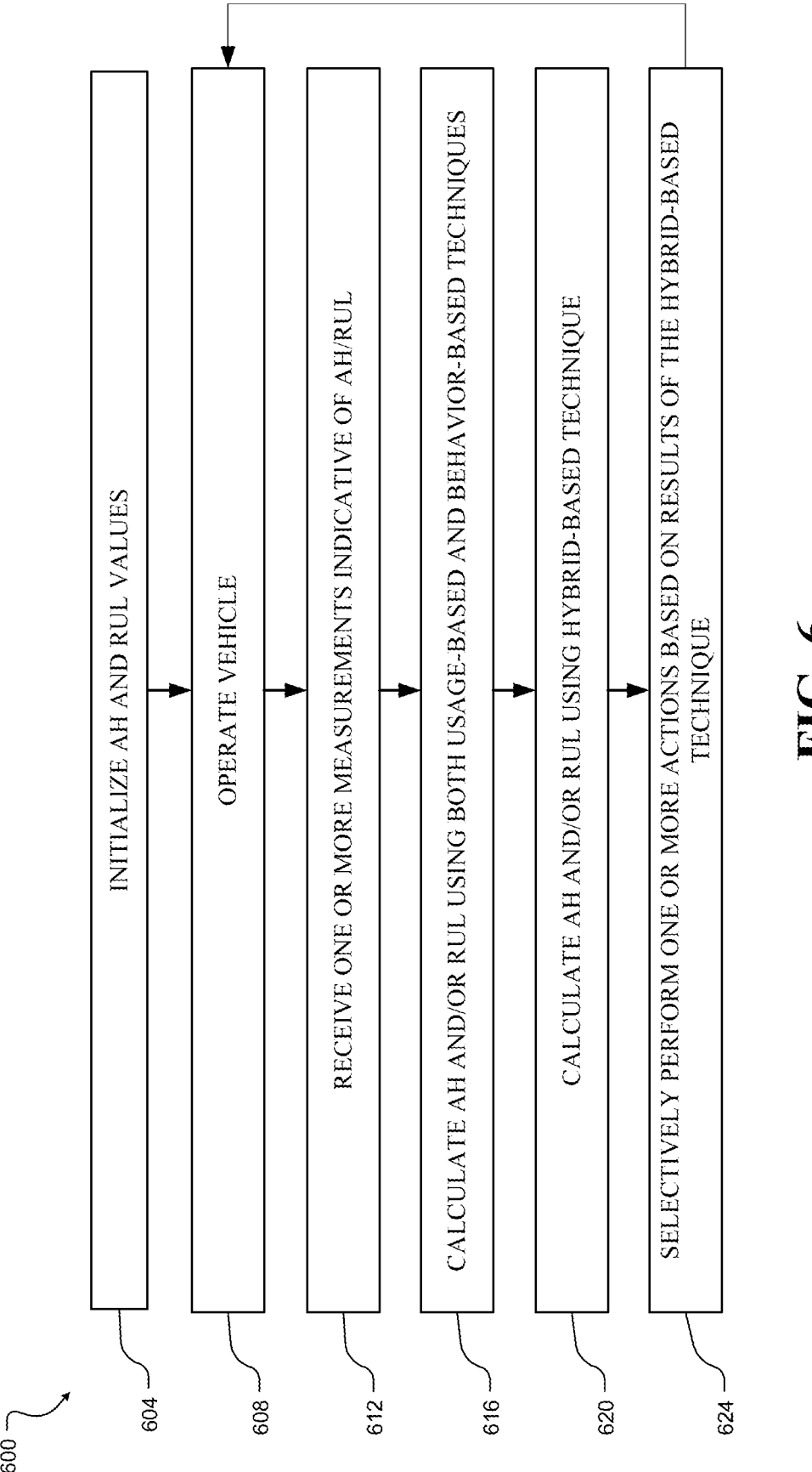
FIG. 6 is a flow diagram generally illustrating steps of an example method for calculating AH and/or RUL according to the principles of the present disclosure.

FIG. 6 is a flow diagram generally illustrating steps of an example method 600 for calculating AH and/or RUL according to the principles of the present disclosure. The method may be performed by one or more components of the systems described herein, such as one or more controllers (e.g., the controller 100), one or more processors or processing devices (e.g., the processor 102), and/or other circuitry. In an example, one or more processors are configured to execute instructions stored in memory to perform the method 600.

At 604, values for one or more indicators of SOH for an electrical connection are initialized, such as AH and/or RUL values. For example, the AH and RUL values are initialized to respective values upon installation or formation of an electrical connection. As one example, the initialized value for AH is a maximum value (e.g., 100%) and the initialized value for RUL is a predetermined baseline RUL value, such as 60 months, 70 months, etc. In some examples (e.g., as described above with respect to FIG. 5E), the initialized value for RUL is significantly greater than a typical expected lifetime of the electrical connection, such as 1.5 times the typical expected lifetime, 2 times the typical expected lifetime, 2.5 times the typical expected lifetime, etc. At 608, the vehicle is operated subsequent to installation of the electrical connection and initialization of the AH and RUL values. For example, the vehicle is operated by a user or driver.

At 612, one or more measurements indicative of AH and/or RUL are generated and received. Measurements may include, but are not limited to, one or more resistances associated with the electrical connection as described herein. In an example, electric power is applied as a sinusoidal current to a motor associated with an EPS system, a response corresponding to the applied power is measured, and a resistance of the electrical connection is calculated based on the current and the response. Other measurements may include measurements associated with usage of the vehicle (i.e., usage-based measurements, such as length of time since installation of the electrical connection, actual usage/ drive time of the vehicle, etc.) and/or measurements associated with driver/vehicle behavior (i.e., behavior-based measurements, such as current applied to the motor, current from the power source, operation characteristics associated with vibration, environmental factors and conditions, etc.).

At 616, AH, RUL or both AH and RUL are calculated using both usage-based and behavior-based techniques. In other words, AH is calculated using a usage-based technique and AH is separately calculated using a behavior-based technique, and/or RUL is calculated using a usage-based technique and RUL is separately calculated using a behavior-based technique. Accordingly, in some examples two separate values are calculated for AH and/or two separate values are calculated for RUL. The AH and RUL values are calculated using respective AH and RUL models or algorithms configured to received one or more inputs indicative of AH/RUL (e.g., the calculated resistance associated with the connection and/or other measurements described herein) and calculated AH/RUL based on the received inputs. In some examples, the AH and RUL models are machine learning models.

At 620, AH, RUL, or both AH and RUL are calculated using a hybrid-based (e.g., a hybrid-weighted-based technique) as described herein. For example, AH and RUL are each calculated using a hybrid-based technique by combining the respective usage-based and behavior-based values calculated at 616. In an example, AH and RUL are calculated (e.g., by a model, algorithm, etc.) using a weighted average of the usage-based and behavior-based values. Various weights and other parameters for the calculation may be stored in memory (such as the memory 104) and retrieved by the method 600 (e.g., by the processor 102) to perform the calculations.

In some examples, the weights may be retrieved from a lookup table that correlates a plurality of different weights (to be applied to each of the usage-based and behavior-based values) to different variable conditions, such as time elapsed since installation of the electrical connection, calculated behavior- and/or usage-based values, etc. In other examples, the weights may be calculated to simply decrease (e.g., for the usage-based values) and/or increase (e.g., for the behavior-based values) over time, as the usage-based and/or behavior-based values decrease, etc.

At 624, one or more actions are performed based on results (i.e., the calculated AH and/or RUL) of the hybrid-based technique. For example, calculated values for AH and/or RUL may be provided to a driver or user, manufacturer, dealership, service facility, etc. As one example, the calculated values are provided to the driver or user via an in-vehicle display or interface (e.g., a display of an infotainment system or other dashboard indicator), a mobile device, etc. In this manner, a user of the vehicle is provided with an accurate indicator of SOH, RUL, etc. of one or more components of the vehicle. The data may be sent to a remote server or cloud computing system for remote analysis, to local diagnostic tools attached to the vehicle (e.g., OBDII readers or other diagnostic devices), etc.

In another example, the vehicle (and/or another entity that receives the results of the calculation) is configured to perform one or more remedial actions based on the calculated values. For example, systems and methods of the present disclosure (e.g., using the controller 100) may be configured to compare the calculated AH and/or RUL values to respective thresholds to determine whether to perform the one or more remedial actions. In other words, the one or more remedial actions may be performed in response to the AH and/or RUL values decreasing below the respective thresholds. In one example, in response to the AH and/or RUL values decreasing below the respective thresholds, a notification or warning may be generated and provided to the driver or user, manufacturer, dealership, service facility, etc. The notification (e.g., a check engine light or other indictors) may indicate that the vehicle is in need of servicing, recommend that the driver or user schedule servicing to replace the electrical connection, etc.

In another example, in response to the AH and/or RUL values decreasing below the respective thresholds, control of one or more vehicle operating parameters (e.g., current provided to the motor, to the controller, etc.) may be adjusted in various conditions (e.g., when a measured temperature of the vehicle or a vehicle system is above a threshold). For example, as AH and/or RUL values decrease, various parameters may be controlled (e.g., current provided to the motor) to minimize additional wear on the electrical connection and avoid failure.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for determining a state of health (SOH) of an electrical connection in a steering system of a vehicle, the method comprising:

using a processor configured to execute instructions to perform steps comprising:

receiving an input indicative of the SOH of the electrical connection, wherein the input includes a resistance associated with the electrical connection, and wherein the SOH corresponds to at least one of an accumulated health (AH) of the electrical connection and a remaining usable life (RUL) of the electrical connection;

calculating, based on the received input and usage associated with the vehicle, a first SOH value, wherein the first SOH value is a usage-based SOH value;

calculating, based on the received input and behavior associated with the vehicle, a second SOH value, wherein the second SOH value is a behavior-based SOH value;

calculating, based on the first SOH value and the second SOH value, a third SOH value, wherein the third SOH value is (i) a hybrid of the usage-based SOH value and the behavior-based SOH value and (ii) an indicator of the AH or the RUL of the electrical connection; and performing at least one action based on the third SOH value.

2. The method of claim 1, further comprising obtaining the resistance by supplying a sinusoidal current to a motor of the steering system, measuring a response of the motor, and calculating the resistance based on the sinusoidal current and the measured response.

3. The method of claim 2, wherein the sinusoidal current is a non-torque producing current.

4. The method of claim 1, wherein the steering system is an electronic power steering (EPS) system and the electrical connection is an electrical connection between a power supply and a motor of the EPS system.

5. The method of claim 1, further comprising calculating the third SOH value as a weighted average of the first SOH value and the second SOH value.

6. The method of claim 5, further comprising assigning weights to the first SOH value and the second SOH value based on at least one of (i) a time elapsed since installation of the electrical connection and (ii) the first SOH value.

7. The method of claim 5, further comprising:

decreasing a first weight assigned to the first SOH value as at least one of (i) a time elapsed since installation of the electrical connection increases and (ii) the first SOH value decreases; and increasing a second weight assigned to the second SOH value as the first weight decreases.

8. The method of claim 1, further comprising initializing the first SOH value and the second SOH value, wherein initializing the first SOH value includes setting the first SOH value to a value greater than an expected remaining usable life of the electrical connection.

9. The method of claim 1, further comprising:

comparing the first SOH value to a threshold;

setting the third SOH value to the first SOH value in response to a determination that the first SOH value is greater than or equal to the threshold; and setting the third SOH value to the second SOH value in response to a determination that the first SOH value is less than the threshold.

10. The method of claim 1, wherein the first SOH value is a first AH value, the second SOH value is a second AH value, and the third SOH value is a third AH value, the method further comprising:

calculating, based on the received input and usage associated with the vehicle, a first RUL value;

calculating, based on the received input and behavior associated with the vehicle, a second RUL value; and calculating, based on the first RUL value and the second RUL value, a third RUL value.

11. The method of claim 1, wherein performing the at least one action includes at least one of:

generating and displaying an indicator of the third SOH value; and controlling at least one operating parameter of the vehicle based on the third SOH value.

12. A system for determining a state of health (SOH) of an electrical connection in a steering system of a vehicle, the system comprising:

at least one sensor configured to generate an output indicative of the SOH of the electrical connection, wherein the output indicates a resistance associated with the electrical connection, and wherein the SOH corresponds to at least one of an accumulated health (AH) of the electrical connection and a remaining usable life (RUL) of the electrical connection; and a controller configured to receive, as an input, the output generated by the at least one sensor, calculate, based on the received input and usage associated with the vehicle, a first SOH value, wherein the first SOH value is a usage-based SOH value, calculate, based on the received input and behavior associated with the vehicle, a second SOH value, wherein the second SOH value is a behavior-based SOH value, calculate, based on the first SOH value and the second SOH value, a third SOH value, wherein the third SOH value is (i) a hybrid of the usage-based SOH value and the behavior-based SOH value and (ii) an indicator of the AH or the RUL of the electrical connection, and perform at least one action based on the third SOH value.

13. The system of claim 12, wherein the controller is configured to obtain the resistance by supplying a sinusoidal current to a motor of the steering system, measuring a response of the motor as sensed by the at least one sensor, and calculating the resistance based on the sinusoidal current and the measured response.

14. The system of claim 13, wherein the sinusoidal current is a non-torque producing current.

15. The system of claim 12, wherein the steering system is an electronic power steering (EPS) system and the electrical connection is an electrical connection between a power supply and a motor of the EPS system.

16. The system of claim 12, wherein the controller is configured to calculate the third SOH value as a weighted average of the first SOH value and the second SOH value.

17. The system of claim 16, wherein the controller is configured to assign weights to the first SOH value and the second SOH value based on at least one of (i) a time elapsed since installation of the electrical connection and (ii) the first SOH value.

18. The system of claim 16, wherein the controller is configured to:

decrease a first weight assigned to the first SOH value as at least one of (i) a time elapsed since installation of the electrical connection increases and (ii) the first SOH value decreases; and increase a second weight assigned to the second SOH value as the first weight decreases.

19. The system of claim 12, wherein the controller is configured to initialize the first SOH value and the second SOH value, wherein initializing the first SOH value includes setting the first SOH value to a value greater than an expected remaining usable life of the electrical connection.

20. The system of claim 12, wherein the first SOH value is a first AH value, the second SOH value is a second AH value, and the third SOH value is a third AH value, and wherein the controller is configured to:

calculate, based on the received input and usage associated with the vehicle, a first RUL value;

calculate, based on the received input and behavior associated with the vehicle, a second RUL value; and calculate, based on the first RUL value and the second RUL value, a third RUL value.

* * * * *